United States Patent
Bois et al.

(10) Patent No.: US 7,746,924 B2
(45) Date of Patent: Jun. 29, 2010

(54) DETERMINATION OF FILTER WEIGHTS

(75) Inventors: Karl Joseph Bois, Fort Collins, CO (US); Dacheng Zhou, Fort Collins, CO (US); Shad R. Shepston, Thornton, CO (US); David W. Quint, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1013 days.

(21) Appl. No.: 11/430,692

(22) Filed: May 9, 2006

(65) Prior Publication Data

US 2007/0263714 A1 Nov. 15, 2007

(51) Int. Cl.
*H03H 7/30* (2006.01)
*H03H 7/40* (2006.01)
*H03K 5/159* (2006.01)

(52) U.S. Cl. ............ 375/232; 375/229; 375/230; 375/231; 375/233; 375/234; 375/235; 375/236; 375/316; 375/340; 375/342; 375/350

(58) Field of Classification Search ......... 375/229–236, 375/316, 340, 342, 350
See application file for complete search history.

(56) References Cited

U.S. PATENT DOCUMENTS

| | | | | |
|---|---|---|---|---|
| 4,027,258 A | | 5/1977 | Perreault | |
| 4,038,536 A | * | 7/1977 | Feintuch | 708/322 |
| 5,058,047 A | * | 10/1991 | Chung | 708/322 |
| 5,335,020 A | * | 8/1994 | Dieterich | 348/614 |
| 5,650,954 A | | 7/1997 | Minuhin | |
| 5,796,814 A | * | 8/1998 | Brajal et al. | 375/232 |
| 6,791,995 B1 | | 9/2004 | Azenkot et al. | |
| 6,834,079 B1 | | 12/2004 | Strait et al. | |
| 6,965,640 B2 | * | 11/2005 | Awad et al. | 375/232 |
| 6,993,099 B2 | | 1/2006 | Zogakis et al. | |
| 7,200,172 B2 | * | 4/2007 | Pukkila et al. | 375/231 |
| 7,200,552 B2 | * | 4/2007 | Chu et al. | 704/219 |
| 7,218,672 B2 | * | 5/2007 | Birru | 375/233 |
| 2002/0163959 A1 | * | 11/2002 | Haddad | 375/229 |
| 2005/0238090 A1 | * | 10/2005 | Ooghe et al. | 375/222 |

OTHER PUBLICATIONS

David Falconer and Lek Ariyavisitakul, "Frequency Domain Equalization For 2-11 GHZ Broadband Wireless Systems", Carleton University, Jan. 18, 2001, pp. 1-36.

* cited by examiner

*Primary Examiner*—Mohammad H Ghayour
*Assistant Examiner*—Sophia Vlahos

(57) ABSTRACT

For a given channel and a filter having at least one filter tap, a set of at least one weight value is determined for the at least one filter tap according to which at least one weight value substantially minimizes a gradient of a frequency response for the given channel and substantially maximizes energy of the frequency response for the given channel within a predetermined bandwidth.

17 Claims, 4 Drawing Sheets

DETERMINATION OF FILTER WEIGHTS

BACKGROUND

The performance of a communications channel tends to vary based on various characteristics of the channel, which may depend on the communication medium over which the signal is transmitted. For the example of an electrically conductive channel, fundamental effects that can adversely affect performance include skin effect and dielectric losses. For a wireless channel, effects of the environment and inherent characteristics of the wireless communication system can impact performance of the channel. These and other losses can create inter-symbol interference that might cause distortion and limit the data rate over the channel.

Various techniques have been developed to compensate for losses that affect signal transmission over a given medium. One approach to compensate for such losses includes distorting the signal, such as is commonly referred to as channel equalization. Channel equalization may be performed at a transmitter, at a receiver or at both the transmitter and receiver, such as by performing pre-emphasis or post-emphasis weighting. The equalization may be implemented in a non-adaptive manner where the channel is equalized and usually remains unmodified. The equalization may also be adaptive in which the equalization parameters are dynamically adjusted between a transmitter and a receiver (e.g., including during operation).

DETAILED DESCRIPTION

Figure 1:
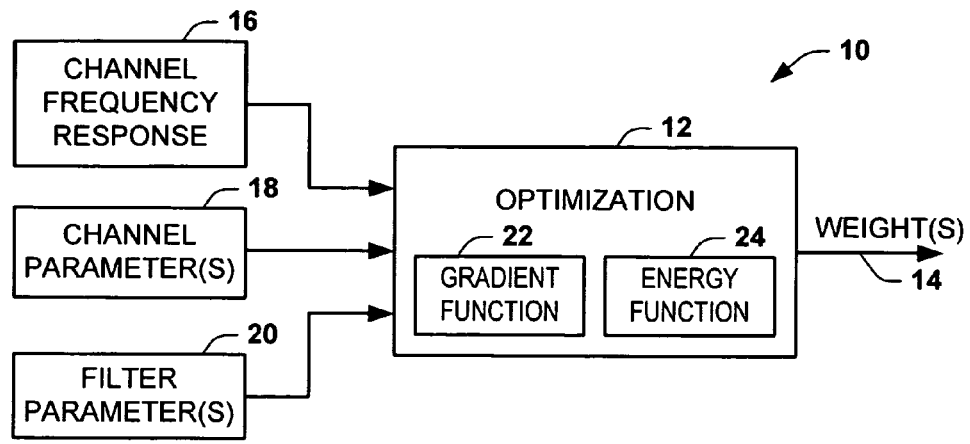
FIG. 1 depicts a block diagram of a system for determining weight values of a filter according to an embodiment of the present invention.

FIG. 1 depicts an example of a system that can be utilized to determine weight values for a filter. For example, the filter can correspond to an N-tap transversal filter, where N is a positive integer greater than or equal to 1 denoting the number of taps in the filter. The system 10 includes an optimization block 12 that is operative to determine a set of one or more weight values, indicated at 14, associated with each tap of the corresponding filter. For example, the optimization block 12 can provide the weight values 14 as an output vector in which a weight value is provided for each of the N taps of the corresponding filter.

The optimization block 12 is operative to determine the set of one or more weight values 14 based on frequency domain data for a given channel as used herein the term "channel" refers to transmission of a signal within a predetermined bandwidth (or band of frequency) over or through a given medium. Unless expressly specified, it will be appreciated that the median may be wired, including an electrically conductive or optical connection, or the medium may be wireless. In the example of FIG. 1, the optimization block employs a channel frequency response 16 for the given channel. The channel frequency response 16 may be determined as part of the process that is utilized to ascertain the weight values 14. Alternatively, the channel frequency response 16 can be ascertained a priori.

Those skilled in the art will understand and appreciate various means (e.g., including hardware, software, or a combination of hardware and software) that can be utilized to determine the channel frequency response for a given channel, which means can vary according to the medium of the given channel. The channel frequency response can be determined by empirical testing or by computer simulation (e.g., using commercially available or proprietary software). For example, a vector network analyzer can determine the frequency response represented as a set of transmission coefficients, each having an amplitude that varies as a function of frequency. As an alternative example, bits of data can be sent over the channel at different rates and the frequency response measured for a given channel by a sensing system (e.g., part of testing equipment). Digital signal processing techniques (e.g., implemented on die or in test equipment) also exist in which a known signal can be transmitted periodically and sampled to find the frequency response as a function of the transmitted signal and the response due to the channel. Another example of an approach that can be utilized to ascertain the channel frequency response 16 is by simulation on a computer programmed to perform a fast Fourier transform (FFT) from the time domain to the frequency domain to provide a corresponding transfer function associated with the given channel that describes the frequency response. Those skilled in the art may appreciate other means that can be utilized to determine the frequency response for the given channel.

The optimization block 12 also employs one or more channel parameters 18 as part of the procedure for determining a set of weight values 14. The channel parameters 16 may include characteristics of the given channel, such as a bandwidth in which the channel is intended to operate. For instance, the bandwidth can be determined a priori. For example, can be determined (e.g., by hardware and/or software) as a function of the known bit rate at which data is to be communicated over the given channel. A set of one or more filter parameters 20 can also be provided to the optimization block 12. The filter parameters 20 can include a vector of N tap delay values, each value identifying the delay associated with a respective one of the N taps of the corresponding filter. A tolerance value can also be provided that identifies the respective amounts of tolerance that a transmitter or receiver can operate within expected operating parameters for a given amount of tap delay. The optimization block 12 determines the set of weight values 14 for the corresponding filter tap that flattens the frequency response of the channel within the bandwidth specified by the channel parameters 18.

By way of further example, the optimization block 12 includes a gradient function 22 and an energy function 24. The gradient function computes a gradient of the frequency response for a range of weight values. The energy function computes energy of the frequency response for the same range of weight values. The optimization block 12 employs the values computed by the gradient function 22 in conjunction with the values computed by the energy function 24 to ascertain which weight values substantially minimize the gradient of the channel frequency response 16 with a substantially maximum amount of energy. Those skilled in the art will appreciate that this results in a set of weight values that achieve a substantially flat frequency response over the desired bandwidth. The optimization block 12 can afford each of the gradient function and energy function substantially equal importance during the optimization. Alternatively, those skilled in the art will understand and appreciate that in certain circumstances, such as depending upon the particular functions being utilized and application requirements, the gradient function 22 and energy function 24 may each be weighted differently (e.g., so the importance of either the flatness or energy of the frequency response is increased). The optimization block 12 can determine the set of weight values 14 over a continuous range of tap coefficients. As used herein in the context of performing optimization, the term "continuous range" means that the precision of the optimization over the tap weight values (or coefficients) is not constrained by an artificially or predetermined step increment, but instead the optimization searches the set of one or more tap coefficients within the constraints of machine precision.

Those skilled in the art will understand and appreciate various types of optimization routines or algorithms that can be implemented as the optimization block 12. The optimization is constrained by the gradient and energy functions for each set of tap weight values. As one example, the optimization block can employ a non-linear least square fitting method of steepest descent. A brute force approach can also be implemented by the optimization block 12, such as where the complete range is weight values are evaluated (e.g., sequentially). Monte Carlo analysis or other generally random optimization technique can be employed by the optimization block 12. These and other optimization algorithms may be available as computer-executable instructions from a set of optimization tools (e.g., MATLAB or other commercially available or proprietary design tools). Such algorithms can be implemented as computer-executable instructions, which can run on a computer (e.g., a workstation, personal computer or computer network) or the algorithm can be instantiated on die (e.g., implemented as part of a communication system or stored in memory for use by an associated processor).

Since the gradient is minimized and the energy is maximized within the known bandwidth (defined by the channel parameters 18) the computational complexity of the optimization can be significantly reduced relative to many existing approaches. Additionally, since the optimization block 12 determines the set of one or more weight values 14 using frequency domain channel characteristics, such as the channel frequency response 16, the likelihood of over equalizing the channel can be mitigated thereby improving the performance of the resulting filter. As another example, the optimization block can be implemented in a non-adaptive manner so that the additional overhead associated with feedback from the given channel can be avoided. By way of further comparison, the optimization block determines filter weights in the frequency domain such that the optimization does not require conversion from the frequency domain to the time domain (e.g., by an inverse fast Fourier transform (IFFT)). It is known that performing an IFFT operation can introduce mathematical errors that may be erroneously compensated by the resulting equalization filter.

Figure 2:
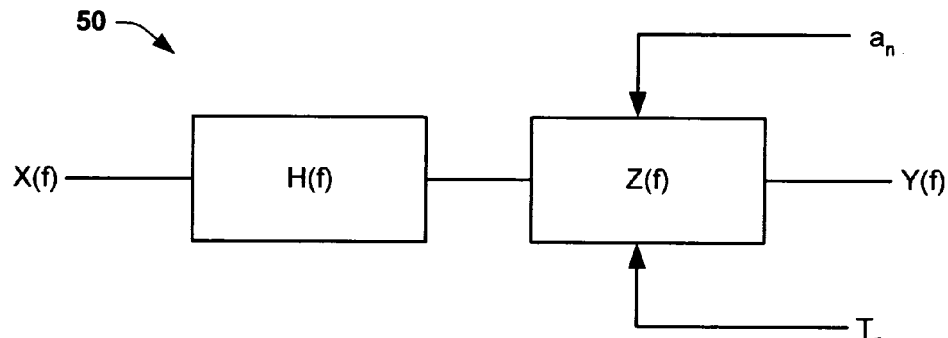
FIG. 2 depicts a transfer function representation of a channel equalized by a filter implemented according to an embodiment of the present invention.

FIG. 2 depicts a transform function representation 50 of channel equalization. An input signal X(f) is provided as a frequency domain input signal to a given channel. The channel has a transfer function indicated at H(f). A transfer function for the filter, indicated at Z(f), is connected in series with filter transfer function H(f) and provides a corresponding compensated or equalized output indicated at Y(f). The transfer function of the filter Z(f) for a transversal filter can be expressed as follows:

$$Z(f) = 1 + \sum_{n=1}^{N} a_n \exp(-j2\pi f T_n) \qquad \text{Eq. 1}$$

where: $a_n$ is the weight of each delay tap, and
$T_n$ is the delay of each respective tap, and where N denotes the number of taps in the filter.

The number of taps and the delay values $T_n$ can be predefined for each respective tap of the corresponding filter, such as depending on the application or circuit design (e.g., as may be dictated by space constraints for an integrated circuit). The number of taps and/or the delay values $T_n$ may also be user configurable, such as may vary depending upon the type and configuration of filter being implemented. As an example, the set of filter delay values $T_n$ can be implemented in multiples of unit intervals of time (UI), such as integer or fractional multiples of UI. The weight coefficients $a_n$ of the filter transfer function Z(f) can be determined by an optimization, such as shown and described herein.

Figure 3:
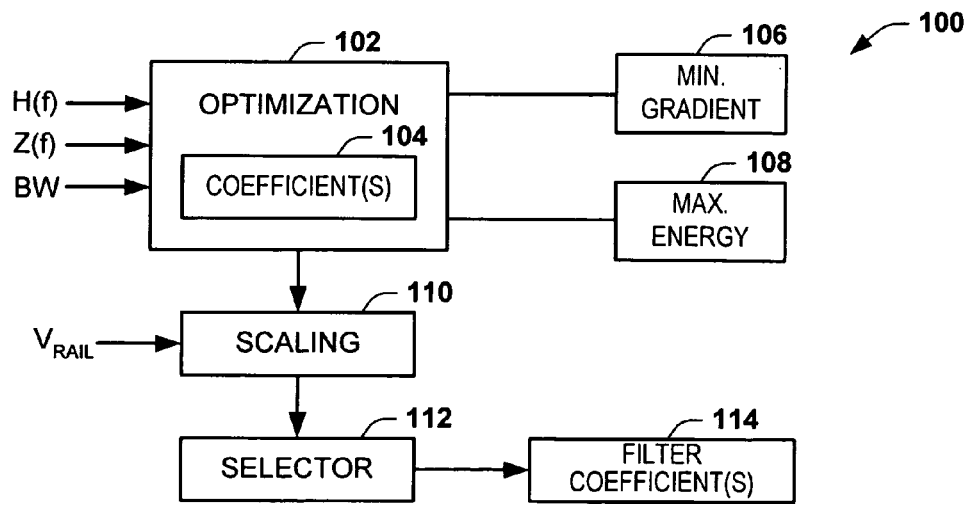
FIG. 3 depicts a block diagram of a system for determining filter coefficients for a communication channel according to an embodiment of the present invention.

FIG. 3 depicts a system 100 that can be utilized to determine filter coefficients for reducing distortion (e.g., due to inter-symbol interference) in a communication channel. The system 100 can be instantiated on a single integrated circuit, for example. Alternatively, different parts of the system 100 can be implemented in different integrated circuits, which may form part of a communication system for communicating data over one or more channels (e.g., wired or wireless). As yet another alternative, the system 100 can be implemented as computer executed instructions, such as implemented as part of a design tool running on one or more computers.

As described herein, the filter coefficients are determined in the frequency domain to reduce distortion or equalize the respective communication channel. The system 100 includes an optimization routine 102 that is operative to determine which coefficient will best equalize a given channel within a bandwidth of interest. The optimization routine 102 employs a representation of a frequency response for a given channel, such as a transfer function H(f) (similar to as shown and described in FIG. 2). The transfer function H(f), for example, can comprise a set of transmission coefficients that represent the amplitude of a transmission signal over the channel as a function of frequency. The transfer function H(f) can be determined according to any of the approaches described herein.

A set of parameters for each tap of the corresponding filter can also be utilized by the optimization routine 102. In the example of FIG. 3, the filter tap parameters can be represented as the transfer function Z(f) (e.g., see Eq. 1), although at least the weight coefficients $a_n$ remain a variable to be determined by the optimization routine 102. For instance, the number of taps and the respective tap delay values $T_n$ for each tap can be determined or set a priori. As an alternative, the tap delay values $T_n$ can also remain a variable that is to be optimized, such as if sufficient computing power exists and the delay values $T_n$ are programmable.

As described herein, the optimization routine 102 determines a set of one or more coefficients that best equalize the given channel over the bandwidth of interest, indicated at (BW). The BW can be any range of frequencies, such as a range from zero to a fundamental frequency (e.g., a low pass filter), one or more other ranges (e.g., a bandpass or notch filter) or a range of frequencies that are above a defined frequency (e.g., a high pass filter) to name a few. The optimization routine 102 computes weight coefficients ($a_n$) 104 that will flatten the frequency response within BW.

The optimization routine 102 can analyze the gradient and energy of the channel frequency response over a continuous range of weight coefficients. A gradient function 106 can compute the gradient of the channel frequency response for the given channel over the bandwidth of interest over the range of coefficients. An energy function 108 can compute the energy of the channel frequency response for the given channel over the bandwidth of interest over the same range of coefficients. The set of filter coefficients that provide, in aggregate, a substantially minimum gradient and substantially maximum energy over the bandwidth of interest are provided by the optimization engine 102 as the weight coefficients 104.

Since the filter coefficients 104 are determined from a continuous range of filter coefficients that equalize a given channel, it is possible that the filter coefficients weight the respective taps such that the absolute value of the sum of tap weights exceeds the available voltage rail for the respective filter. The system 100 thus can include a scaling component 110 that applies a scaling factor to the set of one or more filter coefficients 104 so that the filter operates within an established voltage rail. The scaling component 110 can apply a unity scaling factor (corresponding to the absence of scaling) if the filter coefficients do not cause the filter to operate outside the voltage rail. If the absolute value of the sum of tap weights exceeds the available voltage rail, the scaling system can apply a uniform scaling factor to each of the filter coefficients to provide substantially the same response for the respective tap settings, but such that the sum of the coefficients maintain the filter within the available voltage rail. The voltage rail may vary according to the transmitter or receiver implementing the system 100.

A selector 112 selects a corresponding set of scaled filter coefficients 114 that best match the scaled coefficients provided by the scaling component 110. For example, even though one or more coefficients 104 determined by the optimization routine are determined from a continuous range of filter coefficients, a discrete set of filter coefficients may be available for weighting the filter taps. Accordingly, the selector 112 is operative to provide a corresponding signal (e.g., a digital signal having a predetermined number of bits that defines the number of available weights for each tap) that selects filter coefficients 114 that best match those determined by the optimization routine 102, and which may have been scaled by the scaling component 110.

Figure 4:
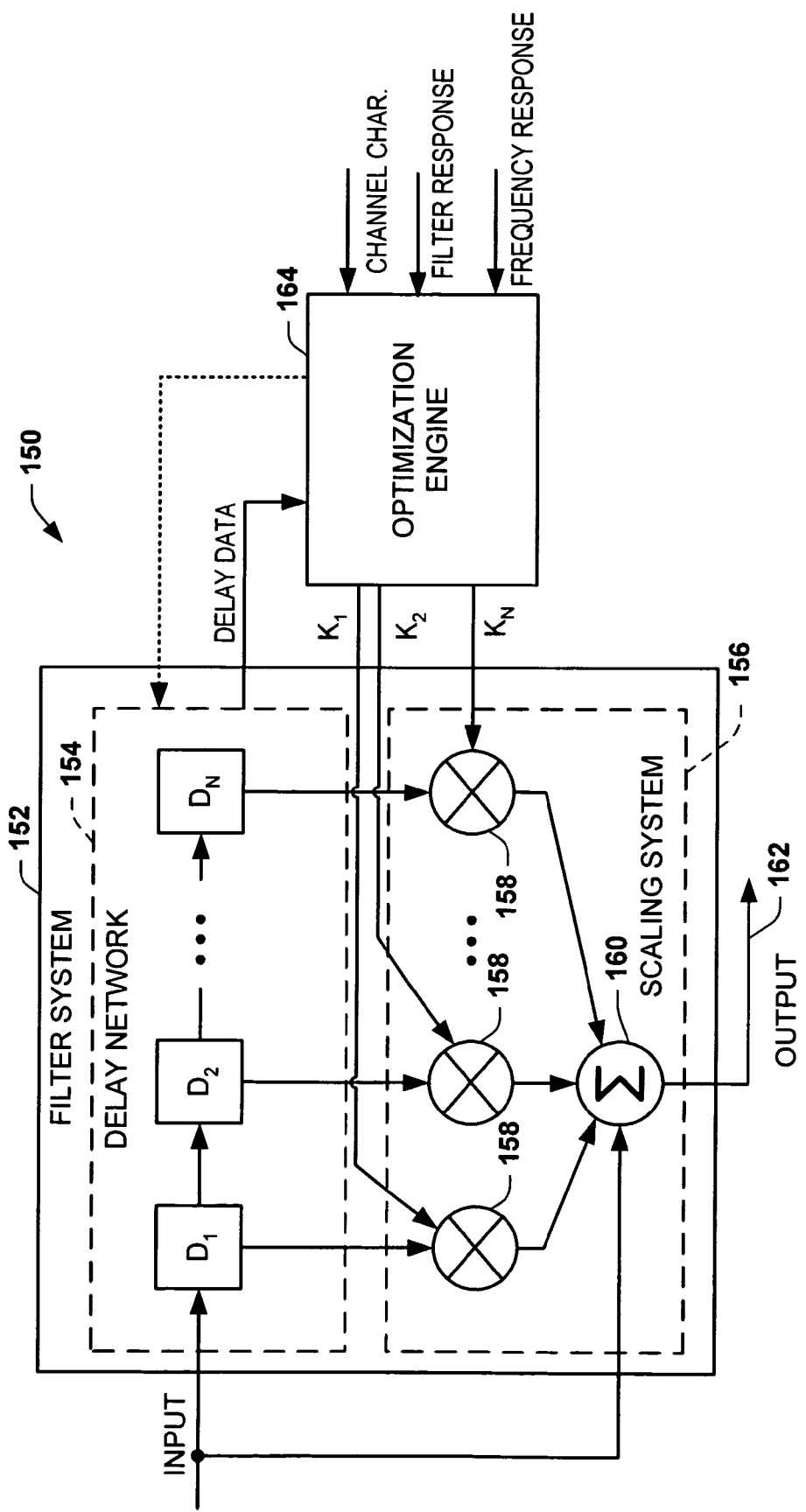
FIG. 4 depicts a block diagram of a filter programmed to implement equalization according to an embodiment of the present invention.

FIG. 4 depicts an example of a system 150 that can be utilized to reduce distortion in a given channel. The system 150 reduces distortion by setting and utilizing weight values for a filter system 152 that substantially flatten the frequency response in a bandwidth of interest for the given channel. For example, the filter system 152 can be implemented as a transversal filter having a delay network 154 and a weighting system 156. For example, the filter system 152 can be implemented as an N-tap transversal filter in which one or more programmable scaling factors are applied to respective delay taps of the filter, where N denotes the number of filter taps. By configuring or programming the filter system 152, based on the teachings contained herein, efficient channel equalization can be implemented for a given channel in the bandwidth of interest.

In the example of FIG. 4, an input signal is provided at a first stage of the delay network 154 having N stages (or taps) of delay, indicated at $D_1$, $D_2$ through $D_N$, where N is a positive integer greater than or equal to 1. Each of the delay elements $D_1$, $D_2$ through $D_N$ can implement a corresponding amount of delay, which may be expressed in UI. The amount of delay for the respective stages can be configured by the user according to the given channel and communication medium that is utilized to communicate the corresponding signal over the channel. The respective stages $D_1$, $D_2$ through $D_N$, of the delay network 154 provide corresponding delayed versions of the input signals to the weighting system 156. The input signal (corresponding to a tap of zero delay) is also provided to the weighting system 156.

The weighting system 156 applies corresponding weight values, indicated at $K_1$, $K_2$ through $K_N$ to the respective delayed versions of the input signal. Each of the weight values $K_1$, $K_2$ through $K_N$ is associated with a respective one of the filter taps $D_1$, $D_2$ through $D_N$. For example, the weighting system 156 can include corresponding multipliers 158 that multiply the delayed version of the input signal by the corresponding weight values $K_1$, $K_2$ through $K_N$ for each of the respective taps. An aggregator 160 aggregates (or sums) the weighted delayed signals and the corresponding input signal to provide a corresponding equalized output signal, indicated at 162. While no weighting is implemented on the input signal that is provided to the aggregator 160, it is to be understood that such signal might also be weighted by applying a corresponding weight value similar to the delayed signals from the filter taps.

As described herein, the weight values $K_1$, $K_2$ through $K_N$ are determined by an optimization engine 164. For example, the optimization engine 164 is programmed and/or configured to determine respective weight values for each tap that substantially minimize a gradient of the channel frequency response over the bandwidth of interest and that substantially maximize energy of the channel frequency response over the bandwidth of interest. That is, the optimization engine determines the respective weight values $K_1$, $K_2$ through $K_N$ based on the filter tap characteristics of the delayed network 154, the frequency response of the given channel and channel characteristics including the bandwidth for the given channel. The optimization engine 154 can be implemented as software, hardware or as a combination of hardware and software according to the teachings contained herein (e.g., see FIG. 3).

Figure 5:
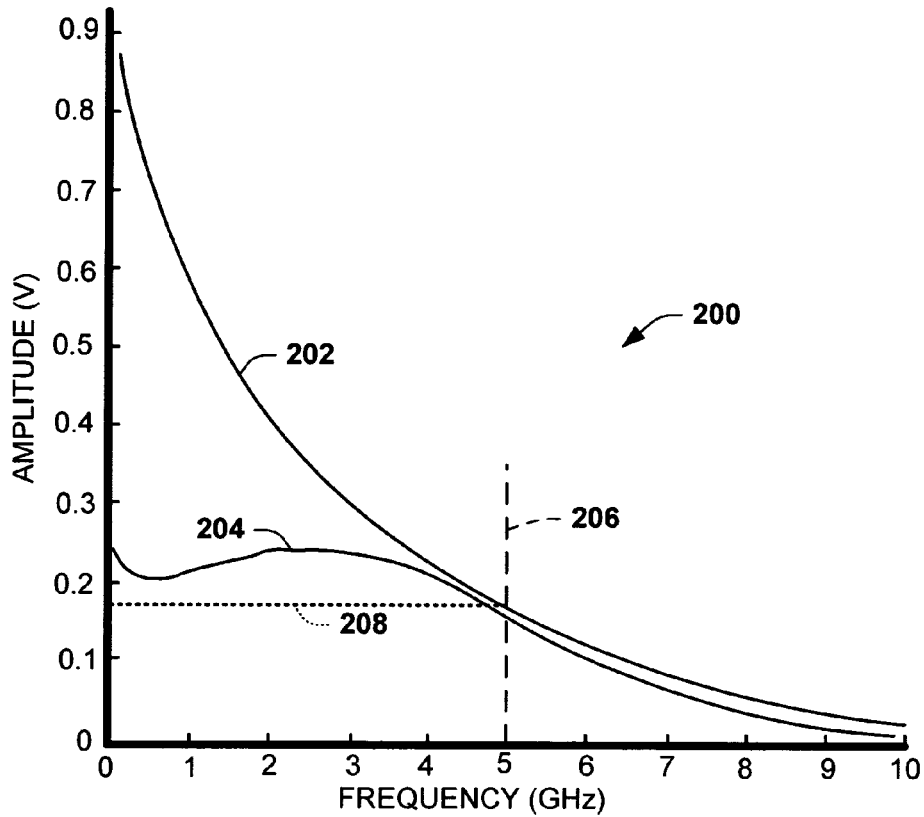
FIG. 5 is a graph of amplitude versus frequency comparing an uncompensated channel and channel compensated by a filter implemented according to an embodiment of the present invention.

FIG. 5 depicts a frequency domain graph 200 in which amplitude is plotted a function of frequency. The graph 200 depicts a comparison of an uncompensated channel response 202 relative to a frequency response 204 corresponding to a channel that has been equalized with a filter programmed and/or configured to minimize the gradient of the channel response over the bandwidth of interest with substantially maximum energy in the bandwidth of interest. In the example of FIG. 5, the bandwidth of interest ranges from zero to a fundamental frequency depicted at 206, corresponding to about 5 GHz. As described herein, the fundamental frequency of 5 GHz corresponds to a bit rate over the given channel at approximately 10 gigabytes per second.

As a further example, FIG. 5 illustrates the equalized channel response 204 and uncompensated channel response 202 for a channel that includes an electrically conductive printed circuit board trace of approximately 20 inches. The equalized channel response is provided for a three-tap transversal filter in which the delays for each of the taps are set respectively to zero, 1*UI and 2*UI. The weights for the respective taps of the corresponding transversal filter have been determined to be approximately 0.6086, approximately −0.03691, and approximately 0.0222.

A corresponding ideal channel response is depicted by a dotted line 208. The ideal response 208 corresponds to a flat line (e.g., having a gradient equal to zero) that intersects the uncompensated channel 202 at the frequency of interest (e.g., the fundamental frequency for the given channel) 206 and that exhibits a sharp cutoff at the fundamental frequency. Those skilled in the art will understand and appreciate that implementing the ideal filter having the channel response indicated by 208 may not be technically feasible at this time due to constraints of existing circuitry. The compensated response 204 provides an efficacious alternative that can be implemented with existing technology based on the teachings contained herein.

Figure 6:
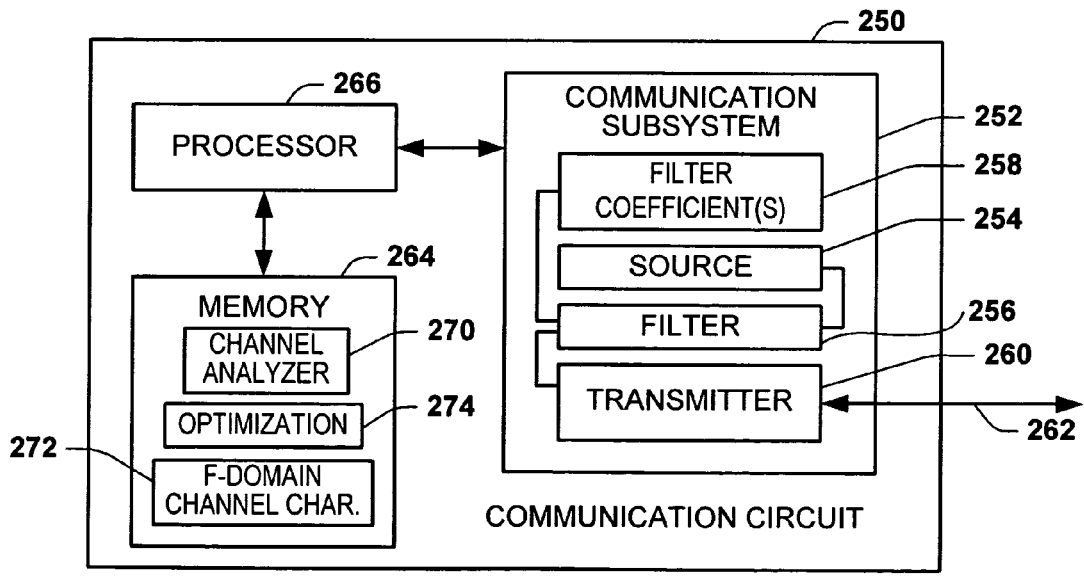
FIG. 6 depicts a communication circuit that can be implemented according to an embodiment of the present invention.

FIG. 6 depicts an example of a communication circuit 250 that includes an instantiation of an optimization routine for determining filter weights, such as can be implemented in or more integrated circuits. The communication circuit 250 includes a communication subsystem 252 that includes a frequency source 254 that supplies a corresponding input signal to a filter 256. The communication subsystem 252 can vary the input signal according to the information being communicated over the given channel. The filter 256, for example, can be implemented as a transversal filter having one or more filter taps that are weighted by a corresponding set of one or more filter coefficients 258. The filter coefficients 258 can be stored as digital data in memory, such as RAM, registers or buffers. For example, the stored digital data can configure a resistor network (not shown) to supply a corresponding set of weights for adjusting the amplitude of the taps of the filter 256.

The filter 256 provides a corresponding filtered output signal to a transmitter 260 that transmits the corresponding output signal over the given channel 262. The filter 256 can be implemented as a transversal filter configured with respective amounts of delay for each of the tap values, such as described herein. The filter coefficients 258 are programmed to weight the respective taps for equalizing (e.g., flattening) the frequency response for the given channel 262 so as to reduce inter-symbol interference.

The filter coefficients 258 can be determined, for example, during a training procedure for the communication circuit 250. In the example of FIG. 6, a processor 266 performs computer executable instructions to ascertain the filter coefficients 258. The computer executable instructions can be stored in the associated memory 254. The processor 266 is in communication with the communication subsystem, such as via a bus or other communication interface, indicated schematically at 268. The computer executable instructions can include a channel analyzer component 270 that operates the communication subsystem 252 to analyze and determines frequency domain channel characteristics 272. The frequency domain channel characteristics may include a frequency response for the given channel 262. The channel analyzer can employ any of various approaches to ascertain the frequency response for the given channel, such as including those described herein. Those skilled in the art will understand and appreciate various algorithms that can be implemented by the channel analyzer 270 to provide means for determining pertinent frequency domain channel characteristics 272, including the channel frequency response. While the channel analyzer component 270 is depicted as being stored in the memory and executed by the processor 266, those skilled in the art will understand and appreciate that the channel analyzer component can be implemented in the communication sub subsystem.

The processor 266 can ascertain a bandwidth of interest for the given channel 262 based on the known bit rate that is to be utilized by the transmitter 260 for communicating data over the given channel 262. Alternatively, the bandwidth for the channel can be stored in the memory 264 or in the communication subsystem 252, such as during initial programming of the circuit 250.

The memory 264 can also include an optimization routine 274 that is utilized to determine the filter coefficients 258, such as described herein. For instance, the optimization routine 274 determines the filter coefficients 258 from a range of continuous coefficients that minimize the gradient over the bandwidth of interest for the frequency response as well as maximize the energy for the channel response over the bandwidth of interest. The optimization routine 274 thus may also include or utilize a gradient function that computes a gradient for the channel frequency response and an energy function that computes energy for the channel frequency response over the bandwidth of interest. As depicted in FIG. 6, the optimization routine 274 can be stored in the memory 264 and executed by the processor 266 to determine and set the filter coefficients 258 in the communication subsystem 252. Alternatively, the optimization routine 274 may be instantiated (e.g., on an integrated circuit die) directly within the communication system 252 or in associated circuitry (not shown). As another example, the channel analyzer component 270 and the optimization routine 274 can both be instantiated on die, such as being part of an integrated circuit in the communication subsystem 252. In this way, the integrated circuit would be configured and programmed to determine the bandwidth of interest for the channel, to determine the channel frequency response and to determine filter coefficients, such as described herein.

As described herein, the optimization routine 274 can determine the filter coefficients without employing adaptive equalization (e.g., no feedback is required to program the filter for performing channel equalization), thereby reducing the complexity of the circuit footprint on the communication circuit 250. Thus, the training sequence implemented by the channel analyzer 270 to determine the frequency domain channel characteristics do not need to change the filter coefficients 258 during the operation of the transmitter when transmitting over the given channel 252. The optimization routine can include periodic or performance induced criteria to adjust the filter coefficients 258, such as if the bit error rate increases to above a predetermined error threshold. The update, which can occur during normal operation, can also be non-adaptive.

Figure 7:
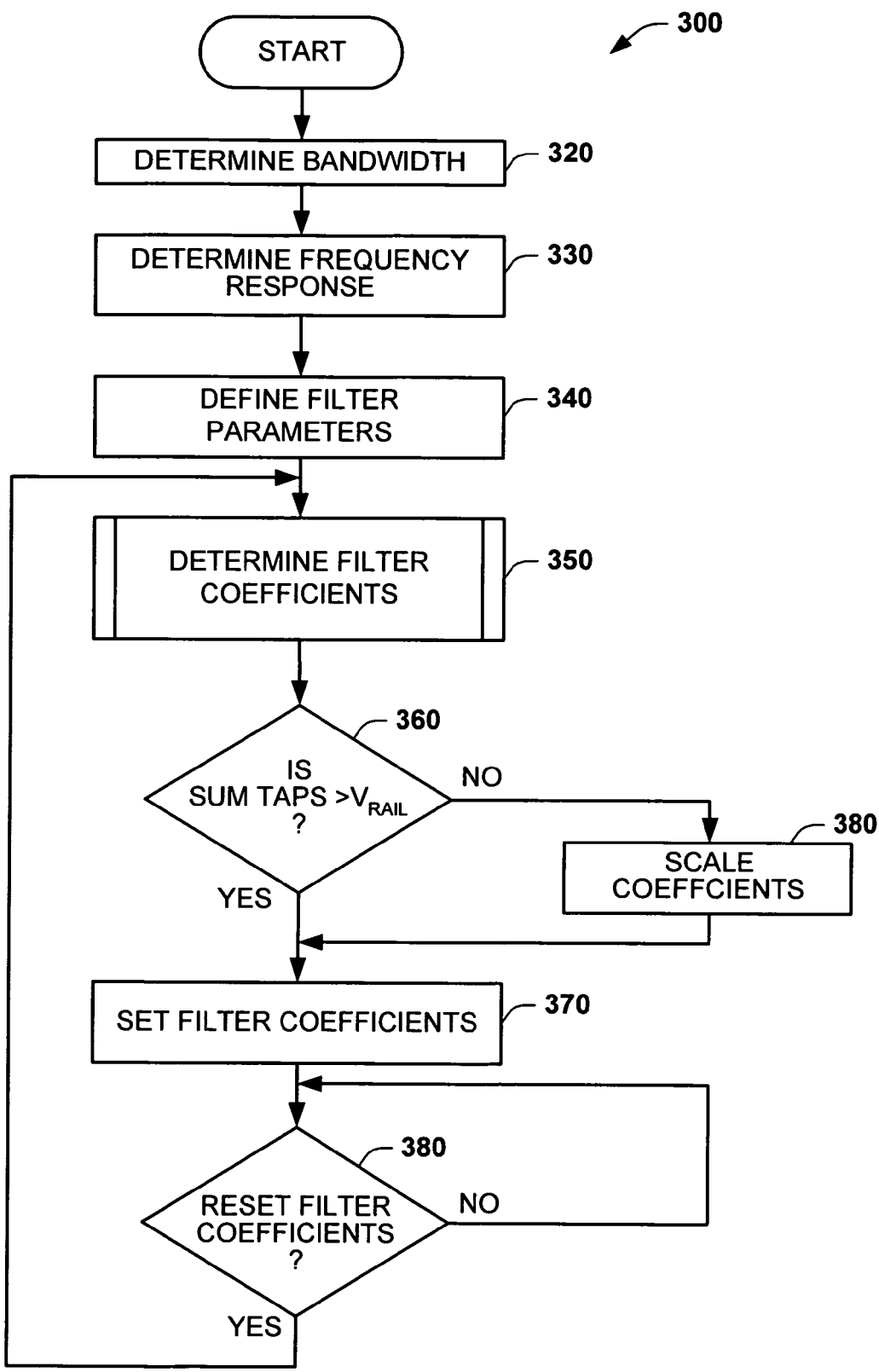
FIG. 7 is a flow diagram illustrating a method according to an embodiment of the present invention.

In view of the foregoing structural and functional features described above, certain methods will be better appreciated with reference to FIG. 7. It is to be understood and appreciated that the illustrated actions, in other embodiments, may occur in different orders and/or concurrently with other actions. Moreover, not all features illustrated in FIG. 7 may be required to implement a method. It is to be further understood that the following methodology can be implemented in hardware (e.g., instantiated on an IC chip, a computer or a computer network), software (e.g., stored in a computer readable medium or as executable instructions running on one or more microprocessors), or as any combination of hardware and software.

FIG. 7 is a flow diagram illustrating a method 300 that can be utilized to determine a set of one or more filter tap coefficients for reducing distortion in a given channel. The method 300 begins at 310 such as manually by user during a simulation process implementing the method. The method can also be initiated during a training process, such as if the method is being instantiated on die (e.g., in one or more integrated circuits). At 310, the given channel for which the filter coefficients are to be determined is known a priori, including the bit rate that data is to be communicated over the given channel.

At 320, a bandwidth for the given channel is determined. The bandwidth can be determined according to a known bit rate that data is to be communicated over the given channel. At 330, the frequency domain channel characteristics for the given channel are determined. The frequency domain channel characteristics can include a channel frequency response, which can be determined according to a variety of approaches such as described herein. At 340, filter parameters can be set. The filter parameters can include the number of taps in the transversal filter as well as the delay values (e.g., $T_N$) for each tap of the filter. It is to be understood that some or all such filter parameters can be determined a priori according to application and/or design requirements or as part of performing the method 300.

At 350, the filter coefficients of the corresponding filter are determined. The determination at 350 can be implemented by an optimization routine running on die or in a computer, such as during a simulation. The optimization can be implemented in the frequency domain and over a continuous range of filter coefficients so as to determine a set of one or more filter coefficients to adjust tap weights for achieving a substantially flat channel frequency response in the bandwidth of interest. For example, the optimization routine can include determining coefficients (or weight values) that minimize the gradient of the frequency response over the bandwidth of interest and also maximize the total energy within the bandwidth of interest. The optimization routine can be considered a constrained optimization technique (being constrained by the gradient and energy values determined within the bandwidth of interest).

At 360, a determination is made as to whether the absolute values of the sum of the taps (e.g., corresponding to the coefficients) are less than or equal to the voltage rail ($V_{RAIL}$). The voltage rail $V_{RAIL}$ can be set according to operating parameters of the transmitter or receiver for which the method 300 is being implemented. If the absolute value of the sum of the taps (corresponding to the optimized filter coefficients determined at 350) are less than or equal to the voltage rail (YES) the method proceeds to 370.

At 370, the filter coefficients are set. Alternatively, if the determination at 360 does not indicate that the sum of the weighted taps is less than the voltage rail (NO), the method proceeds to 380. At 380, scaling is implemented on the optimized filter coefficients to compute the scale in factor that is applied to the respective filter coefficients so that the absolute value of the sum of the weighted taps remain less than or equal to the voltage rail. The same scaling factor can be applied to each of the coefficients to maintain substantially the same filtered channel response, although at a different amplitude level. From 380 the method proceeds to 370 in which the filter weight values are set for the given filter. The filter weights can be set from a predefined set according to which weight values best match the filter coefficients; namely, either the coefficients provided by the optimization routine (if no scaling is used) or the scaled filter coefficients resulting from the scaling at 380.

While the method 300 can be considered non adaptive in that no feedback is necessary to ascertain the filter coefficients it would be understood and appreciated that additional optimization can be performed during operation of a transmitter or receiver circuit to accommodate changes in the channel response such as may be detected by an increase in the bit area rate that may be detected during operation of the corresponding communication system employing a filter. Thus, at 390, a determination can be made as to whether the filter weights should be reset or adjusted. For example, the determination can be made based on a measured bit error rate over the given channel. The communication system itself can be configured to periodically adjust filter weights based on other criteria. If the filter weights are to be adjusted, the method can return to 320 where frequency domain channel characteristics can be determined for the current system configuration and corresponding filter coefficients can be determined. If the filter weights are not to be recomputed, the method can loop at 380 or simply end.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method comprising:
for a given channel and a filter having at least one filter tap, determining a set of at least one weight value for the at least one filter tap according to which at least one weight value substantially minimizes a gradient of a frequency response for the given channel and substantially maximizes energy of the frequency response for the given channel within a predetermined bandwidth;
computing the gradient of the frequency response within the predetermined bandwidth over a range of weight values for the at least one filter tap;
computing the energy of the frequency response within the predetermined bandwidth over the range of weight values for the at least one filter tap; and
determining the set of at least one weight value based on the computed gradient and the computed energy.

2. The method of claim 1, further comprising setting at least one weight value for the at least one filter tap of the filter based on the determined set of at least one weight value, the filter comprising a transversal filter having a predetermined number of filter taps and each of the filter taps introducing a predefined amount of delay.

3. The method of claim 1, wherein the filter comprises a plurality of filter taps, each of the filter taps having a predefined amount of delay, a respective weight value being determined for each of the plurality of filter taps to define a corresponding set of weight values for the filter according to which set of weight values substantially minimize the gradient of the frequency response for the given channel in the predetermined bandwidth and substantially maximize energy of the frequency response for the given channel in the predetermined bandwidth.

4. The method of claim 3, wherein the determination of the corresponding set of weight values further comprises employing an optimization algorithm to select the set of the at least one weight value over a continuous range of weight values.

5. The method of claim 3, further comprising scaling the at least one weight value so that an absolute value of the corresponding set of weight values, in aggregate, is less than or equal to a voltage rail.

6. The method of claim 1, further comprising determining the predetermined bandwidth according to a bit rate that is desired for communication of data over the given channel.

7. The method of claim 1, further comprising determining the frequency response for the given channel as part of a training sequence for configuration of communication over the given channel.

8. A system comprising:
an N-tap transversal filter, a programmable weight being applied to at least one of the N taps of the N-tap filter, where N is a positive integer greater than or equal to 1;
at least one of a transmitter or a receiver connected with the N-tap filter to transmit or receive, respectively, a data signal that is communicated over a given channel, the given channel having a channel frequency response and having a bandwidth that is functionally related to a known bit rate for communicating the data signal over the given channel;
an optimization system that non-adaptively determines at least one weight value for the at least one of the N taps based on an amount of weighting determined to substantially minimize a gradient of the channel frequency response over the bandwidth with a substantially maximum energy, the programmable weight of the N-tap filter being set based on the at least one weight value;
a gradient function that computes the gradient of the channel frequency response for the given channel over the bandwidth for a continuous range of weight values; and
an energy function that computes an amount of energy for the frequency response for the given channel over the bandwidth for the continuous range of weight values.

9. The system of claim 8, wherein the N-tap filter further comprises:
a delay network comprising at least two stages (N≧2), each of the at least two stages providing a respective delayed version of the data signal according to a predetermined amount of delay associated with each respective stage; and
a weighting system that is configured to apply a programmable weight to each of the delayed versions of the input signal delay to provide corresponding weighted signals, the weighted signals being aggregated to provide a corresponding aggregate signal having a compensated channel response over the bandwidth.

10. The system of claim 8, wherein the optimization system is instantiated on an integrated circuit die, the optimization system providing the at least one weight value to set the programmable weight of the N-tap filter.

11. The system of claim 8, in which at least the optimization system is instantiated on an integrated circuit.

12. The system of claim 8, further comprising:
memory that stores computer-executable instructions corresponding to the optimization system; and
at least one processor that executes the computer-executable instructions to determine the at least one weight value that is used to set the programmable weight of the N-tap filter.

13. The system of claim 8, further comprising a scaling component that scales the at least one weight value as a function of the voltage rail employed by the at least one of a transmitter or a receiver to provide, the programmable weight of the N-tap filter being set based on the at least one scaled weight value.

14. The system of claim 8, further comprising a selector that is configured to set the programmable weight for each of the N taps from a discrete set of available weights based on the at least one weight value determined by the optimization system.

15. A system comprising:
means for analyzing transmission of a signal over an associated channel to obtain a frequency domain representation that describes amplitude of the signal transmitted over the associated channel as a function of frequency;
means for filtering the signal with a transfer function that varies, in the frequency domain, as a function of at least one predefined tap delay value and at least one programmed weight value respectively associated with each of at least one filter tap of the means for filtering;
means for computing at least one filter coefficient of the transfer function that substantially flattens the frequency domain representation of the signal within a bandwidth of interest for the associated channel, the at least one programmed weight value being provided based on the at least one filter coefficient;
means for computing, over a continuous range of filter coefficients, the gradient of a channel frequency response for the frequency domain representation within the bandwidth of interest; and
means for computing, over the range of filter coefficients, an area under a curve corresponding to the channel frequency response within the bandwidth of interest to determine energy of the channel frequency response, the means for computing at least one filter coefficient determining the at least one filter coefficient according to which at least one coefficient substantially minimizes the computed gradient and substantially maximizes the computed energy.

16. The system of claim 15, further comprising means for scaling the selected at least one weight value as a function of a voltage rail utilized by the system.

17. The system of claim 15, further comprising means for determining the bandwidth of interest based on a known bit rate for communicating the signal over the associated channel.

* * * * *